United States Patent
Yoo et al.

(10) Patent No.: US 10,496,185 B2
(45) Date of Patent: Dec. 3, 2019

(54) INPUT DEVICE AND DISPLAY DEVICE INCLUDING THE SAME

(71) Applicant: SAMSUNG ELECTRONICS CO., LTD., Suwon-si (KR)

(72) Inventors: Ho June Yoo, Seoul (KR); Nam Su Ha, Anyang-si (KR); Shin A Kim, Seongnam-si (KR); Eun Seo Kim, Gimpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/794,650

(22) Filed: Oct. 26, 2017

(65) Prior Publication Data

US 2018/0120956 A1    May 3, 2018

(30) Foreign Application Priority Data

Oct. 31, 2016  (KR) .................. 10-2016-0143287

(51) Int. Cl.
| | |
|---|---|
| *G06F 3/0338* | (2013.01) |
| *G06F 3/038* | (2013.01) |
| *H05K 1/14* | (2006.01) |
| *H05K 5/00* | (2006.01) |
| *G05G 9/047* | (2006.01) |

(Continued)

(52) U.S. Cl.
CPC ....... *G06F 3/0338* (2013.01); *G05G 9/04796* (2013.01); *G06F 3/038* (2013.01); *H05K 1/147* (2013.01); *H05K 5/0017* (2013.01); *G05G 2009/04755* (2013.01); *H04N 5/645* (2013.01);

(Continued)

(58) Field of Classification Search
CPC .. G06F 3/0338; G06F 3/03547; G06F 3/0414; G06F 3/038; G05G 9/047; G05G 2009/04755; H01H 25/04; G01D 5/142; H05K 1/182; H05K 1/147; H05K 5/0017;

(Continued)

(56) References Cited

U.S. PATENT DOCUMENTS

| | | | |
|---|---|---|---|
| 4,654,576 A * | 3/1987 | Oelsch | G05G 9/047 200/6 A |
| 2003/0220142 A1* | 11/2003 | Siegel | A63F 13/06 463/37 |

(Continued)

FOREIGN PATENT DOCUMENTS

| | | |
|---|---|---|
| EP | 2 439 616 A1 | 4/2012 |
| WO | 2012/051357 A1 | 4/2012 |

OTHER PUBLICATIONS

Communication dated Feb. 7, 2018 by the International Searching Authority in counterpart International Patent Application No. PCT/KR2017/011654. (PCT/ISA/210).

(Continued)

*Primary Examiner* — James Wu
(74) *Attorney, Agent, or Firm* — Sughrue Mion, PLLC

(57) ABSTRACT

A display device including a display panel, a chassis configured to support the display panel, and an input device disposed on the chassis, wherein the input device includes a manipulator configured to be horizontally movable and vertically movable, the manipulator comprising a magnet, and a sensor configured to detect a change in a magnetic force due to a motion of the magnet as a result of a motion of the manipulator, and to receive an input command based on the detected change in the magnetic force.

19 Claims, 17 Drawing Sheets

(51) Int. Cl.
   *H04N 5/645* (2006.01)
   *H05K 1/18* (2006.01)
(52) U.S. Cl.
   CPC ....... *H05K 1/189* (2013.01); *H05K 2201/056* (2013.01)
(58) Field of Classification Search
   CPC ... H05K 1/189; H05K 2201/056; H04N 5/645
   See application file for complete search history.

(56) References Cited

U.S. PATENT DOCUMENTS

| | | |
|---|---|---|
| 2006/0131156 A1 | 6/2006 | Voelckers |
| 2008/0112119 A1 | 5/2008 | Wang et al. |
| 2008/0174550 A1 | 7/2008 | Laurila et al. |
| 2009/0115404 A1* | 5/2009 | Peterson ................ G01R 33/07 324/207.2 |
| 2010/0173711 A1 | 7/2010 | Jaouen |
| 2010/0236911 A1* | 9/2010 | Wild ...................... H01H 3/022 200/345 |
| 2012/0274563 A1* | 11/2012 | Olsson ................... G05G 9/047 345/161 |
| 2013/0249830 A1 | 9/2013 | Quek |
| 2016/0228767 A1 | 8/2016 | Nakayama et al. |

OTHER PUBLICATIONS

Communication dated Jul. 8, 2019, issued by the European Patent Office in counterpart European Application No. 17865675.7.

\* cited by examiner

INPUT DEVICE AND DISPLAY DEVICE INCLUDING THE SAME

CROSS-REFERENCE TO RELATED APPLICATION

This application claims priority to and the benefit of Korean Patent Application No. 10-2016-0143287, filed on Oct. 31, 2016, the disclosures of which is incorporated herein by reference in its entirety.

BACKGROUND

1. Field

Exemplary embodiments consistent with the present disclosure relate to an input device and display device including the same, and more particularly, to an input device to implement a slim display device.

2. Discussion of Related Art

With the development of imaging technology, display devices have undergone various changes, and there is a need for display devices having various functions.

A display device may be an apparatus for displaying a screen, such as a monitor, a television, etc. The display device may be equipped with an input device to manipulate channels, volume, power sources, etc. As such a display device has multiple functions, importance of the input device is also growing.

A plurality of buttons may be provided in the display device for various settings and functions. With the plurality of buttons in the display device, however, the size of the display device becomes large and spoils a simplicity of appearance. Therefore, a need exists for an input device which has a single button to manipulate various functions and maintain a slim figure, and a display device including the same.

SUMMARY

An aspect of the present disclosure provides an input device enabling manipulation of various menus.

Another aspect of the present disclosure provides a display device including an input device while maintaining a slim appearance.

Another aspect of the present disclosure provides an input device with an improved structure to facilitate a user's manipulation, and a display device including the input device.

According to an aspect of an exemplary embodiment, a display device includes a display panel, a chassis configured to support the display panel, and an input device disposed on the chassis, wherein the input device includes a manipulator configured to be horizontally movable and vertically movable, the manipulator comprising a magnet, and a sensor configured to detect a change in a magnetic force due to a motion of the magnet as a result of a motion of the manipulator, and to receive an input command based on the detected change in the magnetic force.

The display device may further include an elastic member configured to elastically support the manipulator, and to separate the manipulator from the sensor.

The elastic member may be configured to elastically support a horizontal motion of the manipulator and a vertical motion of the manipulator, and to return the manipulator to an original position of the manipulator after completion of the horizontal motion and the vertical motion.

The elastic member may include an elastic supporter having a top surface, wherein an outer circumference of the elastic supporter decreases toward the top surface, and a combiner formed on the top surface of the elastic supporter, the combiner being combined with the manipulator.

The manipulator may further include a handle configured to be manipulated by a user, a handle supporter extending from the handle and elastically supported by the elastic member, and a magnet holder including a holder body to which the magnet is fixed, and a holder supporter extending from the holder body and combined with the handle supporter, wherein the combiner is located between the handle supporter and the holder body.

The combiner may include a combining hole through which the holder supporter may be configured to pass, and a circumference of the handle supporter may be greater than a diameter of the combining hole, and a circumference of the holder body may be greater than the diameter of the combining hole.

The display device may further include a case including a motion guide configured to limit a horizontal motion of the manipulator, and the motion guide may include a pair of first guides configured to limit a first directional motion of the manipulator to remain with a first range, and a pair of second guides connected to the pair of first guides, the pair of second guides being configured to limit a second directional motion of the manipulator to a second range, the second directional motion being perpendicular to the first directional motion.

The display device may further include a controller configured to execute an input command based on the change in the magnetic force detected by the sensor.

The display device of may further include a printed circuit board having a first side and a second side, wherein the sensor is mounted on the first side, and an elastic member arranged on the second side of the printed circuit board, wherein the elastic member is extended toward the manipulator, and may be configured to elastically the manipulator to an original position of the manipulator after completion of a vertical motion of the manipulator.

The display device may further include a printed circuit board having the sensor mounted on a side of the printed circuit board, wherein the printed circuit board is arranged in parallel with a vertical movement direction of the manipulator.

The input device may include a case including a motion guide configured to limit a horizontal motion of the manipulator, wherein the motion guide comprises a first guide configured to guide a motion of the manipulator in a first direction, and a second guide configured to guide a motion of the manipulator in a second direction, the second direction being perpendicular to the first direction.

The handle supporter may include a concave spring insertion groove, the input device may include a case configured to receive the manipulator, the case may be configured to include the sensor, and to include a leaf spring in contact with the handle supporter, and the leaf spring may include a base supported in the case, and a swollen spring area extending from the base and configured to be inserted into the concave spring insertion groove to produce elastic force from a movement of the manipulator.

The handle may include a handle body including a circular plate, and a concave contact area formed on the handle body.

The handle may include a handle body comprising a circular plate, and a plurality of frictional grooves arranged in a lattice pattern formed on the handle body to increase frictional force.

According to another aspect of an exemplary embodiment, and input device includes a case, a handle configured to be exposed outside of the case for manipulation, a manipulator having a magnet configured to be horizontally and vertically movable by a movement of the handle, a sensor module including a sensor configured to detect a change in a magnetic force due to a movement of the magnet, the sensor being mounted on a printed circuit board, and an elastic member configured to elastically support the manipulator and separate the manipulator from the sensor.

The elastic member may include a base part supported by the sensor module, an elastic supporter extending upward from the base part, wherein an outer circumferential surface of the elastic supporter is inclined upward, and a combiner formed on a top surface of the elastic supporter, the combiner being combined with the manipulator.

According to another aspect of an exemplary embodiment, a display device includes a display panel, and an input device located on a side of the display panel, the input device including a case, a manipulator including a magnet, the manipulator being exposed from the case and configured to be horizontally movable and vertically movable, a mount including a mounting part configured to allow the manipulator to be movable, the mount being vertically movable within the case, and a sensor configured to detect a change in a magnetic force due to a motion of the magnet.

The display device may further include an elastic member arranged between the manipulator and the mounting part to elastically support a horizontal movement of the manipulator and a vertical movement of the manipulator.

The display device may further include an auxiliary elastic member arranged between the manipulator and the case to elastically support the manipulator within the case.

The manipulator may include a motion limitation protrusion protruding toward the case and configured to contact a stopper protruding from an inside surface of the case to limit a motion of the manipulator.

According to another aspect of an exemplary embodiment, a display device includes a display panel, a chassis configured to support the display panel, and an input device including a manipulator having a first portion configured to extend from the chassis, and a second portion configured to extend into the chassis, a magnet disposed on the second portion of the manipulator, a sensor configured to detect a change in a magnetic force due to a motion of the magnet caused by a motion of the manipulator, and an elastic member disposed between the sensor and the manipulator, wherein the elastic member may be configured to elastically support the manipulator such that the magnet is suspended separate from the sensor, and a controller configured to interpret the detected change in the magnetic as an input command.

BRIEF DESCRIPTION OF THE DRAWINGS

The above and other objects, features and advantages of the present disclosure will become more apparent to those of ordinary skill in the art through the description of exemplary embodiments with reference to the accompanying drawings, in which.

DETAILED DESCRIPTION

Figure 1:
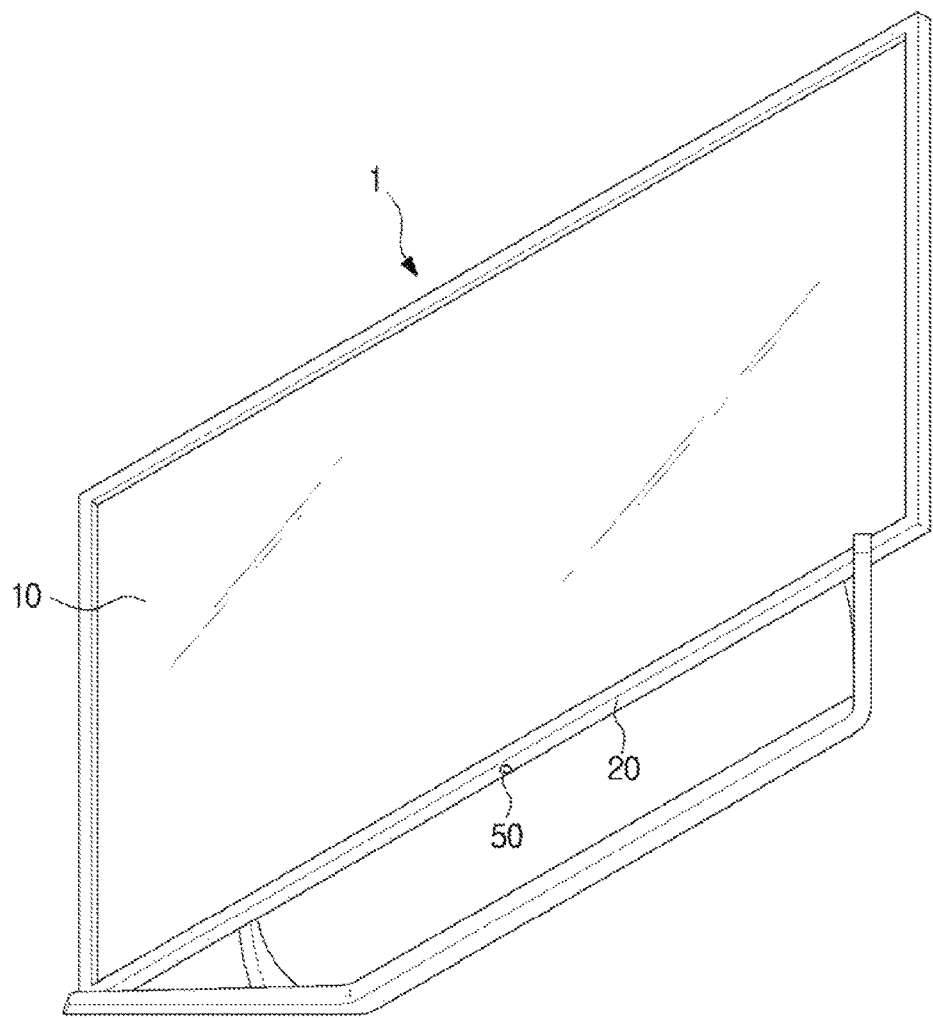
FIG. 1 is a perspective view of a display device, according to an exemplary embodiment.

Exemplary embodiments and features as described and illustrated in the present disclosure are only examples, and various modifications thereof also fall within the scope of the disclosure.

Throughout the drawings, like reference numerals generally refer to like parts or components.

The terminology used herein is for the purpose of describing particular exemplary embodiments only and is not intended to limit the present disclosure. It is to be understood that the singular forms "a," "an," and "the" include plural references unless the context clearly dictates otherwise. It will be further understood that the terms "comprises" and "comprising," when used in this specification, specify the presence of stated features, integers, steps, operations, elements, and components, but do not preclude the presence or addition of one or more other features, integers, steps, operations, elements, components, and groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the present disclosure. Descriptions shall be understood as to include any and all combinations of one or more of the associated listed items when the items are described by using the conjunctive term "and/or," or the like.

Reference will now be made in detail to exemplary embodiments, examples of which are illustrated in the accompanying drawings, wherein like reference numerals refer to the like elements throughout.

Figure 2:
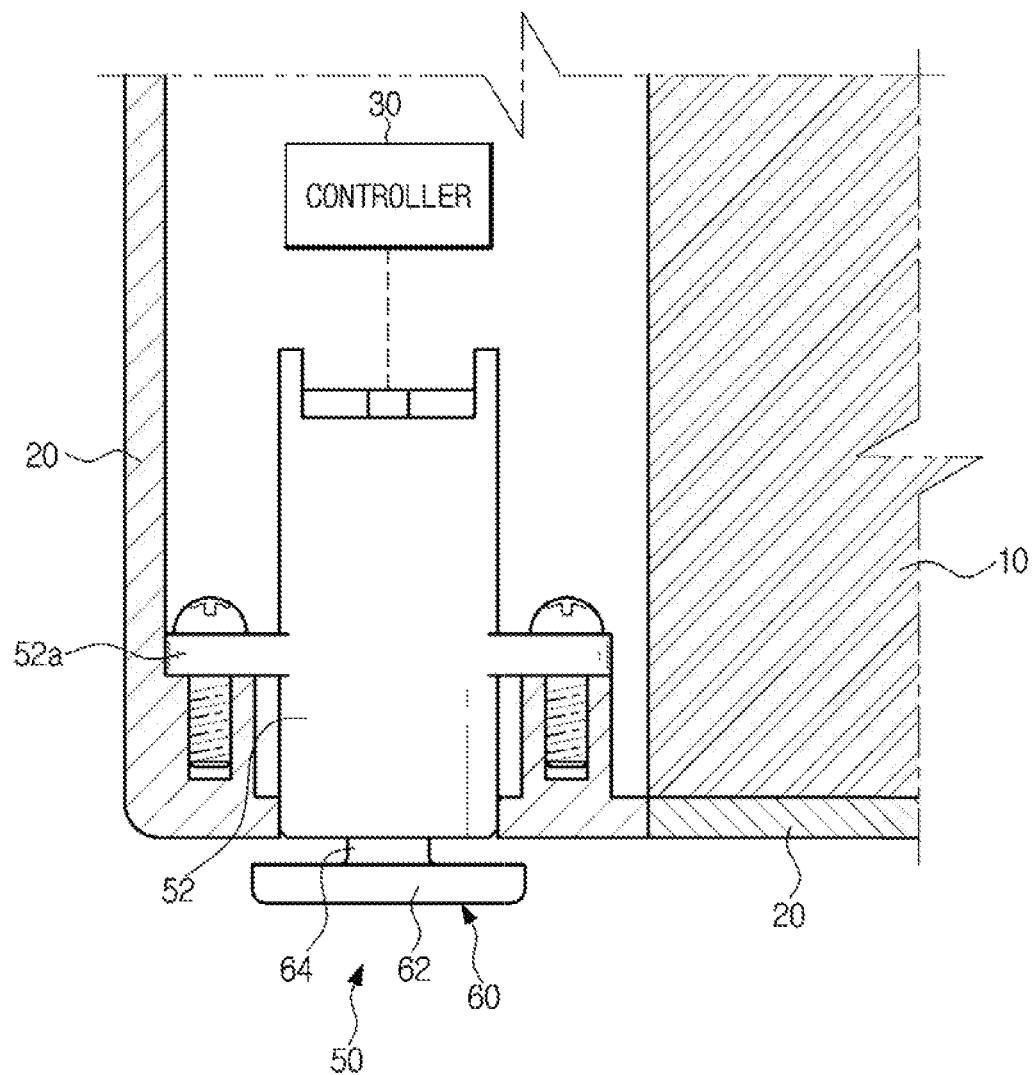
FIG. 2 is a cross-sectional view of a part of a display device with respect to arrangement of an input device, according to an exemplary embodiment.

FIG. 1 is a perspective view of a display device, according to an exemplary embodiment, and FIG. 2 is a cross-sectional view of a part of a display device with respect to arrangement of an input device, according to an exemplary embodiment.

A display device 1 may be described as a flat display device for convenience of explanation, but it is not limited thereto, and any description may applied to a curved display device with both ends protruding forward relative to the center portion, or a bendable or flexible display device that may vary between curved state and flat state.

The description may also be applied to any display device regardless of the screen size. For example, the display device 1 may be a product that may be mounted on the table, wall, or ceiling, such as a smart television, a monitor, etc., or a portable product such as a tablet, a laptop, a smart phone, an e-book, etc.

According to an exemplary embodiment, display device 1 may include a display module to display an image, and a chassis 20. The display module may include a display panel 10 for displaying an image, and a back light unit for supplying light to the display panel 10.

The chassis 20 may be arranged to support the display module. The chassis 20 may hide other parts than the display panel from outside to protect the components of the display device 1 from being damaged from exterior influences. That is, the chassis 20 may be configured to cover at least one side of the display panel 10 or display module.

The display device 1 may include an input device 50.

The input device 50 may send a signal generated by, or as a result of, manipulation of the input device 50 to a controller 30 to perform a function of the display device 1. The input device 50 may be located under the display device 1, but the location of the input device 50 is not limited thereto. For example, the input device 50 may be located on the side of the display device 1 with a manipulation part located toward the front. Alternatively, the input device 50 may be installed on the rear side of the display device 1.

Figure 3:
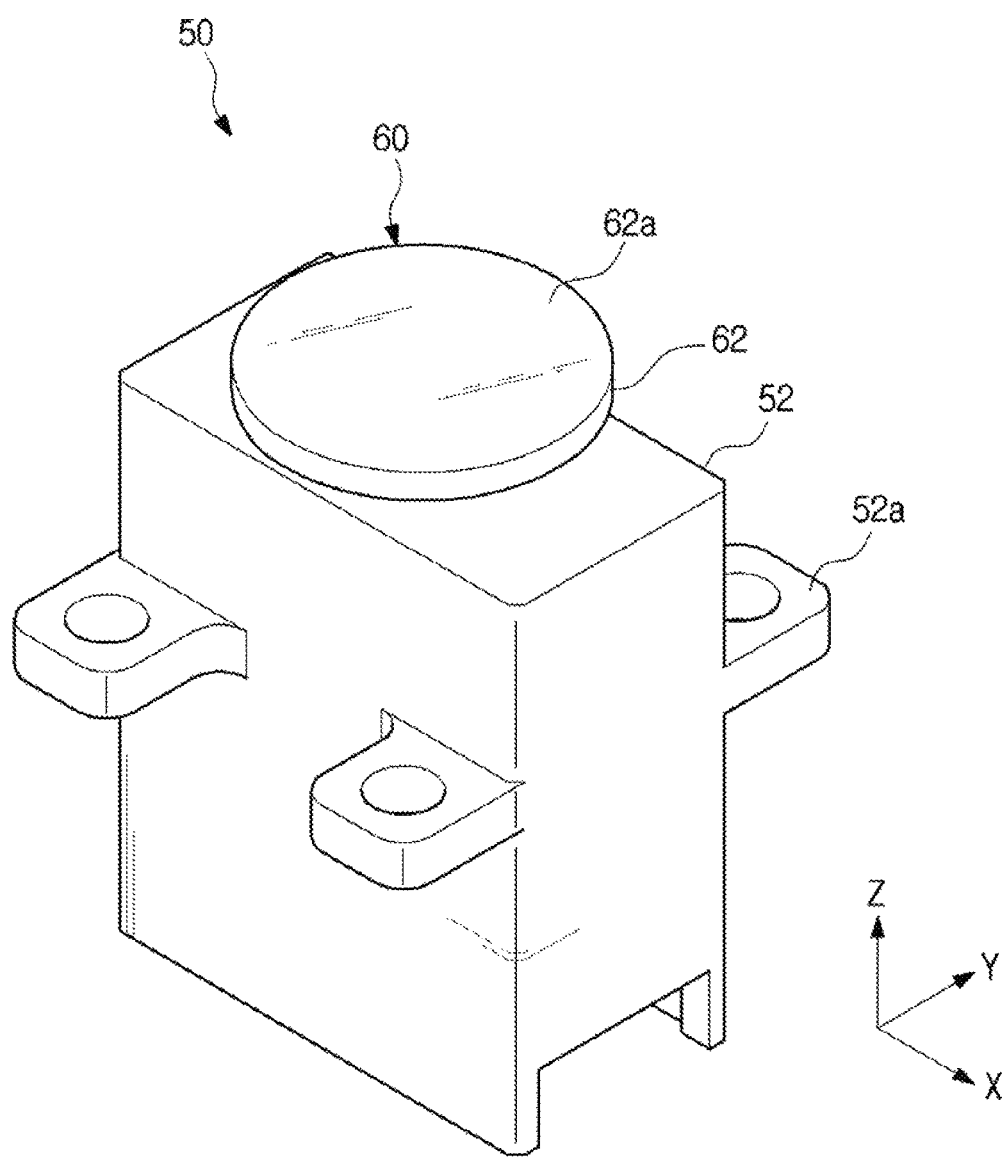
FIG. 3 is a perspective view of an input device, according to an exemplary embodiment.
Figure 4:
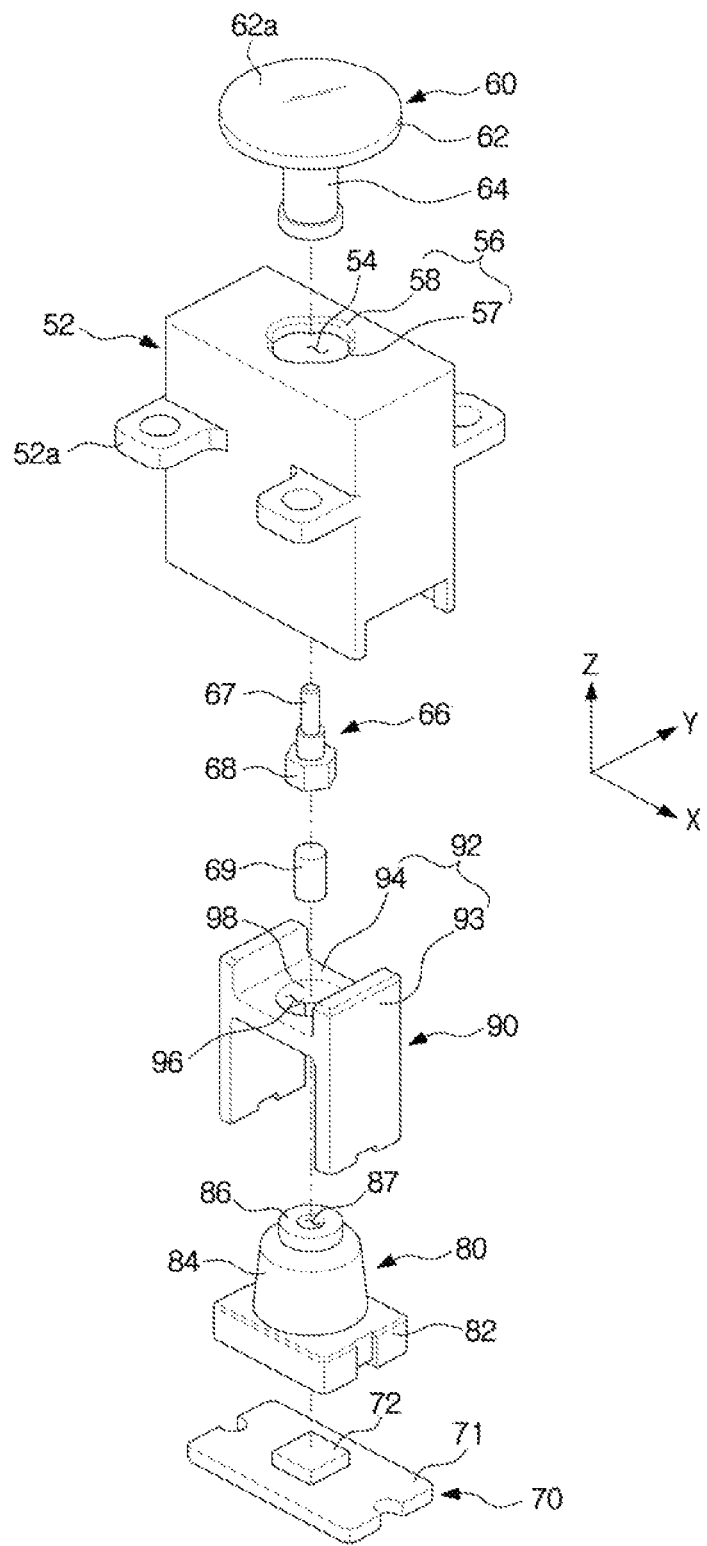
FIG. 4 is an exploded view of an input device, according to an exemplary embodiment.
Figure 5:
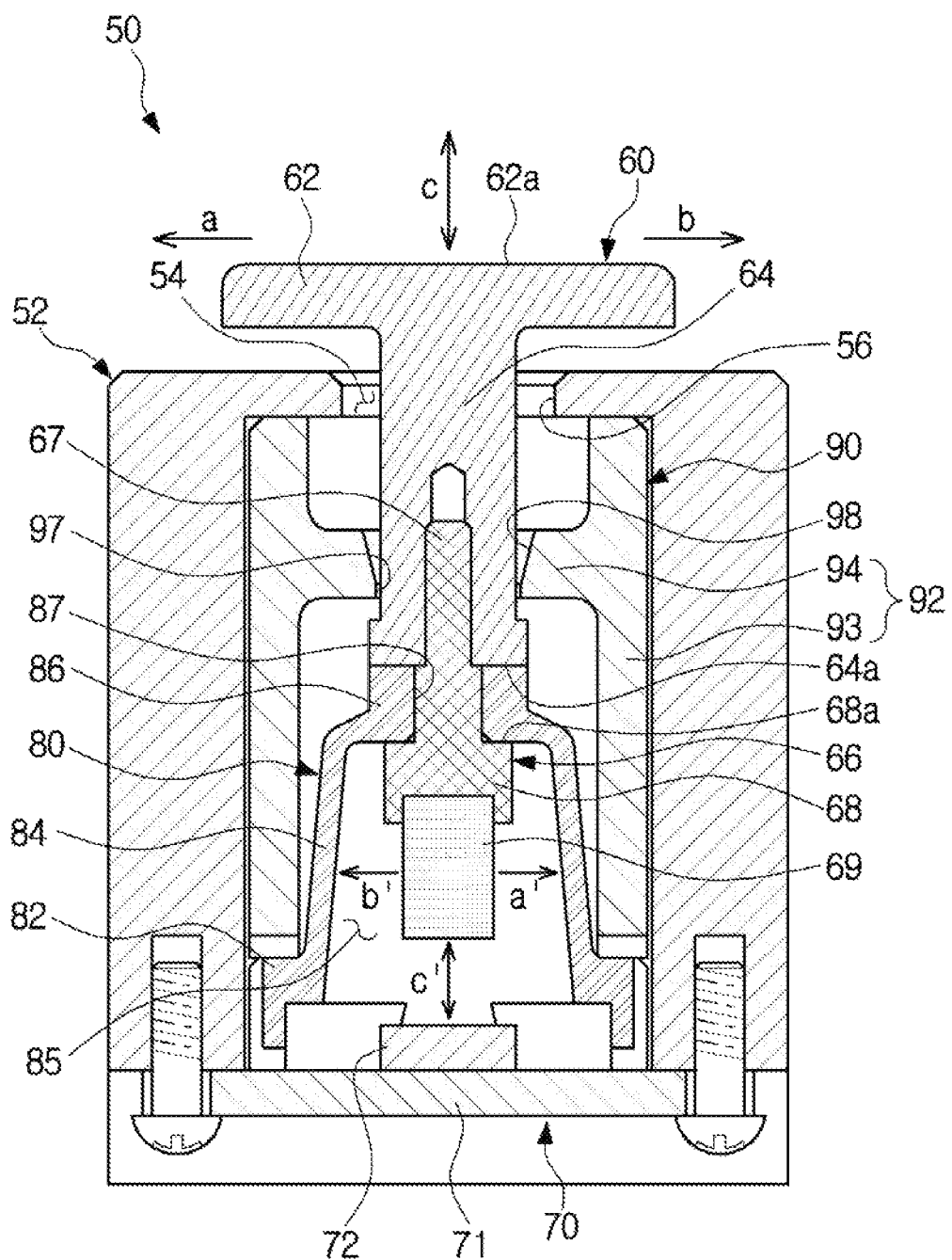
FIG. 5 is a cross-sectional view of an input device, according to an exemplary embodiment.

FIG. 3 is a perspective view of an input device, according to an exemplary embodiment, FIG. 4 is an exploded view of an input device, according to an exemplary embodiment, and FIG. 5 is a cross-sectional view of an input device, according to an exemplary embodiment.

The input device 50 may include a manipulator 60 and a sensor module 70.

The manipulator 60 may be configured to be movable in the horizontal and vertical directions. Specifically, the manipulator 60 may be manipulated horizontally on the X- and Y-axes, and manipulated vertically along the Z-axis.

The manipulator 60 may include a handle 62, a handle supporter 64, and a magnet 69.

The handle 62 may be configured to allow the user to contact and manipulate the handle 62. The handle 62 may be, for example, a substantially circular plate. The form of the handle 62, however, is not limited thereto. A contact area 62a may be formed on the top of the handle 62 for the user to make contact. The handle 62 may be configured to be slidingly movable. In exemplary embodiments, the manipulator 60 may not significantly protrude from the display device 1.

The handle supporter 64 may extend from the handle 62 and may be elastically supported by an elastic member 80, which is be described in further detail below. The handle supporter 64 may be shaped substantially like a rod.

The magnet 69 may be configured to be movable along with the movement of the manipulator 60. The magnet 69 may be integrated into the manipulator 60 to be operated integrally. The magnet 69 may be located under the handle supporter 64, and the operation or position of the magnet 69 may be detected by a sensor 72, which is be described in further detail below. For example, if the magnet 69 is moved by manipulating the handle 62, the sensor 72 may detect a change in magnetic force of the magnet 69. The change in magnetic force detected by the sensor 72 may be forwarded to the controller 30 to be interpreted as an input command.

The manipulator 60 may further include a magnet holder 66. The magnet holder 66 may be configured to fix the magnet 69 and combined with the handle supporter 64. The magnet holder 66 may include a holder body 68 to which the magnet 69 is fixed, and a holder supporter 67 extending from the holder body 68 and combined with the handle supporter 64.

The holder supporter 67 may be screwed into the handle supporter 64, but the method of attachment is not limited thereto.

The sensor module 70 may detect operation of the manipulator 60, and send the detection result to the controller 30. The sensor module 70 may include a sensor 72 and a printed circuit board 71. The controller 30 may be configured to execute an input command corresponding to each input operation based on the detection result from the sensor module 70.

The sensor 72 may include, for example, a tri-axis hall sensor. The sensor 72 may be mounted on the printed circuit board 71. The sensor 72 may be located on the same axis as the magnet 69 in a basic position. In the present exemplary embodiment, the magnet 69 and the sensor 72 may be located on the same Z-axis. The sensor 72 may detect a change in magnetic field from movement of the magnet 69 in a precise manner. In exemplary embodiments, the magnet 69 and the sensor 72 may not be arranged on the same axis. The sensor 72 may detect a change in magnetic flux around it. The change in magnetic flux detected by the sensor 72 may be sent to the controller 30 to interpret an input command from the operation of the manipulator 60.

An elastic member 80 may be configured to elastically support the manipulator 60. Specifically, the elastic member 80 may be configured to elastically support the manipulator 60 to be slidingly moved.

The elastic member 80 may be formed of an elastic material, and configured to elastically deformed by an external force and may elastically return to its original position when the external force is released.

The elastic member 80 may elastically support the manipulator 60 while separating the manipulator 60 and the sensor 72 of the sensor module 70

The elastic member 80 may include an elastic supporter 84 and a combiner 86.

The elastic supporter 84 may be formed such that the circumferential surface has an upward inclination. For example, the elastic supporter 84 may be formed to have a circumference of an upper part smaller than a circumference of a lower part. The elastic supporter 84 may have the shape of a corn, with a smaller cross-section toward the top. This shape may enable the manipulator 60 to be moved to its original position with a lateral elastic return force if the manipulator 60 is moved in the horizontal direction and moved to its original position with a vertical elastic return force if the manipulator 60 is moved in the vertical direction.

The elastic supporter 84 may form a separating gap 85, within which the magnet 69 and the sensor 72 may be separated. The separating gap 85 formed by the elastic supporter 84 may enable non-contact manipulation by separating the magnet 69 and the sensor 72. The non-contact type input device 50 may prevent the internal components from wearing out due to repeated operations, thereby extending the life span of the product. Furthermore, the non-contact type input device 50 may detect the movement of the manipulator 60 more precisely, and thus generate a more stable and reliable input signal.

A combiner 86 may be configured to combine the manipulator 60 with the elastic member 80. The combiner 86 may be formed on the top of the elastic supporter 84.

The combiner 86 may include a combining hole 87 through which part of the manipulator 60 passes. The holder supporter 67 of the holder body 66 may have the shape of a pillar, and have a thickness equal to or smaller than the diameter of the combining hole 87. The holder supporter 67 may be placed to pass through the combining hole 87, and an end of the handle supporter 64 may be located on the top of the combiner 86 and the holder body 68 of the magnetic holder 66 may be located under the combiner 86.

In exemplary embodiments, the combiner 86 may be located between the handle supporter 64 and the holder body 68, thereby fixing the manipulator 60 to the elastic member 80. An area 64a of the handle supporter 64 facing the combiner 86, and an area 68a of the holder body 68 facing the combiner 86 may be formed to be larger than the diameter of the combining hole 87.

The elastic member 80 may include a base part 82. The base part 82 may be formed in the lower portion of the elastic supporter 84 such that the elastic supporter 84 may be supported by the sensor module 70.

A case 52 may form the exterior of the input device 50. The case 52 may be configured to expose the handle 62 of the manipulator 60 to the outside, for example an area outside of chassis 20, or outside of display device 1. The case 52 may have a moving hole 54 through which the handle supporter 64 passes. The case 52 may have a combining protrusion 52a formed on the outer side of the case 52 to be combined with the chassis 20 and fixed.

The case 52 may form the moving hole 54, and include a motion guide 56 to limit horizontal movement of the manipulator 60.

The motion guide 56 may include a pair of first guides 57 to limit a motion in the first direction along the X-axis to a certain range, and a pair of second guides 58 to limit a motion in the second direction along the Y-axis to a certain range. The first and second guides 57, 58 may be connected to each other. In the present exemplary embodiment, the first guide and second guides 57, 58 are shaped like arcs. For example, the first and second guides 57, 58 may be interconnected to form a circle, each guide having the shape of an arc.

The motion guide 56 may limit the motion of the manipulator 60 to prevent the manipulator 60 from being forcedly moved, and instead allow the manipulator 60 to be manipulated within a certain range.

The input device 50 may include a frame 90.

The frame 90 may be located inside the case 52, and may support the internal components together with the case 52.

The frame 90 may include a frame body 92 comprised of a vertical frame body 93 and a horizontal frame body 94.

The frame 90 may include a pair of vertical frame bodies 93 facing each other, and the horizontal frame body 94 may be placed between the pair of vertical frame bodies 93. The pair of vertical frame bodies 93 may be configured to support the inner wall of the case 52.

The frame 90 may include a guide hole 96 formed in the vertical frame body 93. The guide hole 96 may be formed for the handle supporter 64 to pass through. A guide hole forming part 97 that forms the guide hole 96 may have a guide area 98 not to interfere with the motion of the handle 62.

The guide area 98 may be formed along the guide hole forming part 97 and may have an inclination such that the circumference of the upper part of the guide area 98 is wider than that of the lower part of the guide area 98. This may prevent the handle 62 moving in the horizontal direction from being interfered with and limited by the guide hole forming part 97. Although the input device 50 includes the frame 90 in exemplary embodiments, the frame 90 may be omitted in some other exemplary embodiments. The handle 62 of the input device 50 may be operated not in a tilting way but in a sliding way, and the movement of the handle 62 in the sliding way may prevent the handle 62 from protruding significantly from the case 52, allowing miniaturization of the input device 50.

Operation of exemplary embodiments of the input device and the display device including the input device will now be described.

In exemplary embodiments, the user may manipulate the input device 50 of FIGS. 1 to 5 to perform a function of the display device 1.

Specifically, the user may manipulate the manipulator 60 of the input device 50 to be moved horizontally in the X-axis, Y-axis, or a combined direction of the X and Y-axes, or moved vertically along the Z-axis by a clicking operation. The magnet 69 may be moved as well due to the movement of the manipulator 60, and the sensor 72 may detect the movement and generate a signal.

For example, if the manipulator 60 is moved in direction a, the magnet 69 is also moved in the direction a'; if the manipulator 60 is moved in direction b, the magnet 69 is also moved in the direction b'; if the manipulator 60 is moved in direction c, the magnet 69 is also moved in the direction c'. Although the movements in the directions a and b of the manipulator 60 or the directions a' and b' of the magnet 69 are opposite to each other in this exemplary embodiment, it is not limited thereto but may be in the same direction. The directivity occurring between the manipulator 60 and the magnet 69 may be adjusted by manipulation of the controller 30.

The controller 30 may include a processor and a memory, and there may be a plurality of processors integrated in a single chip or physically separated from each other.

The controller 30 may include a micro computer, a sub-micro computer, or a main central processing unit (CPU).

Figure 6A:
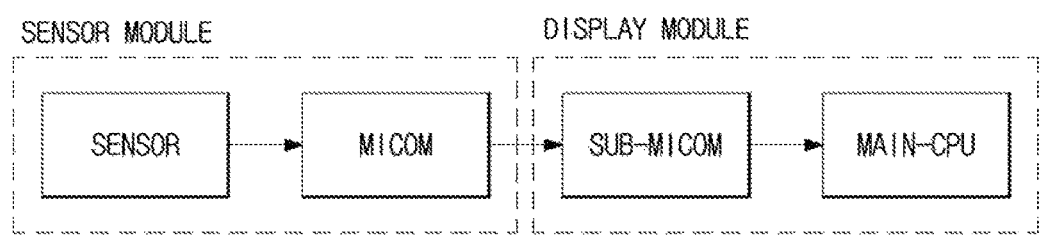
FIGS. 6A, 6B, 6C, and 6D illustrate operations of an input device and a display device, according to an exemplary embodiment.
Figure 6B:
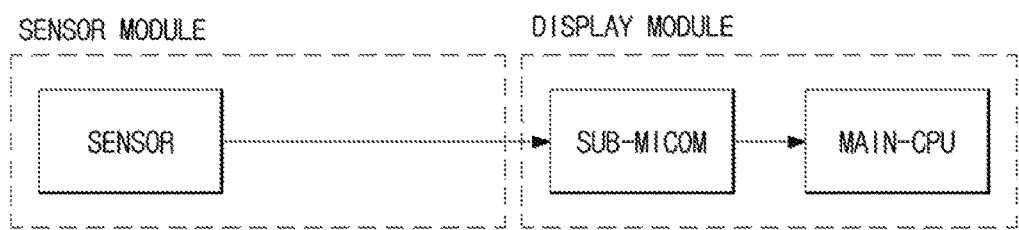
Figure 6C:
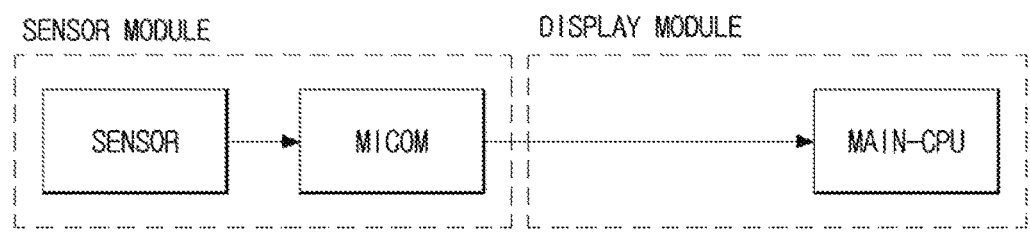
Figure 6D:
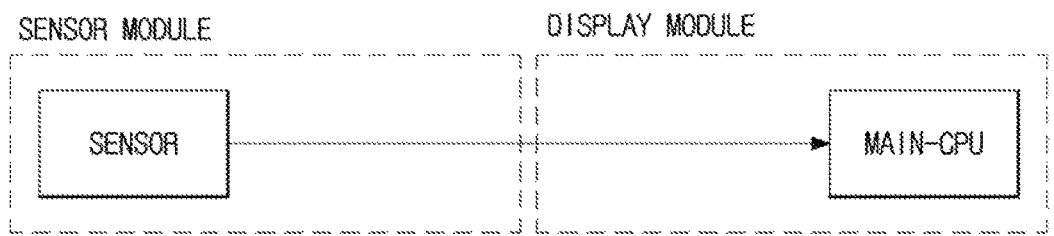

As shown in FIGS. 6A, 6B, and 6C, the controller 30 may include at least one of a micro computer and a sub-micro computer. The micro computer may belong to the sensor module 70, while the sub-micro computer may belong to a display module. A change in magnetic force detected by the sensor 72 may be converted by the micro computer or the sub-micro computer to a signal and forwarded to a main CPU. Upon reception of the signal, the main CPU may perform an input command. Alternatively, as shown in FIG. 6D, the controller 30 may send a change in magnetic force detected by the sensor 72 directly to the main CPU to perform an input command.

Another exemplary embodiment of an input device and display device including the input device will now be described. The same configurations as explained above will be omitted.

Figure 7:
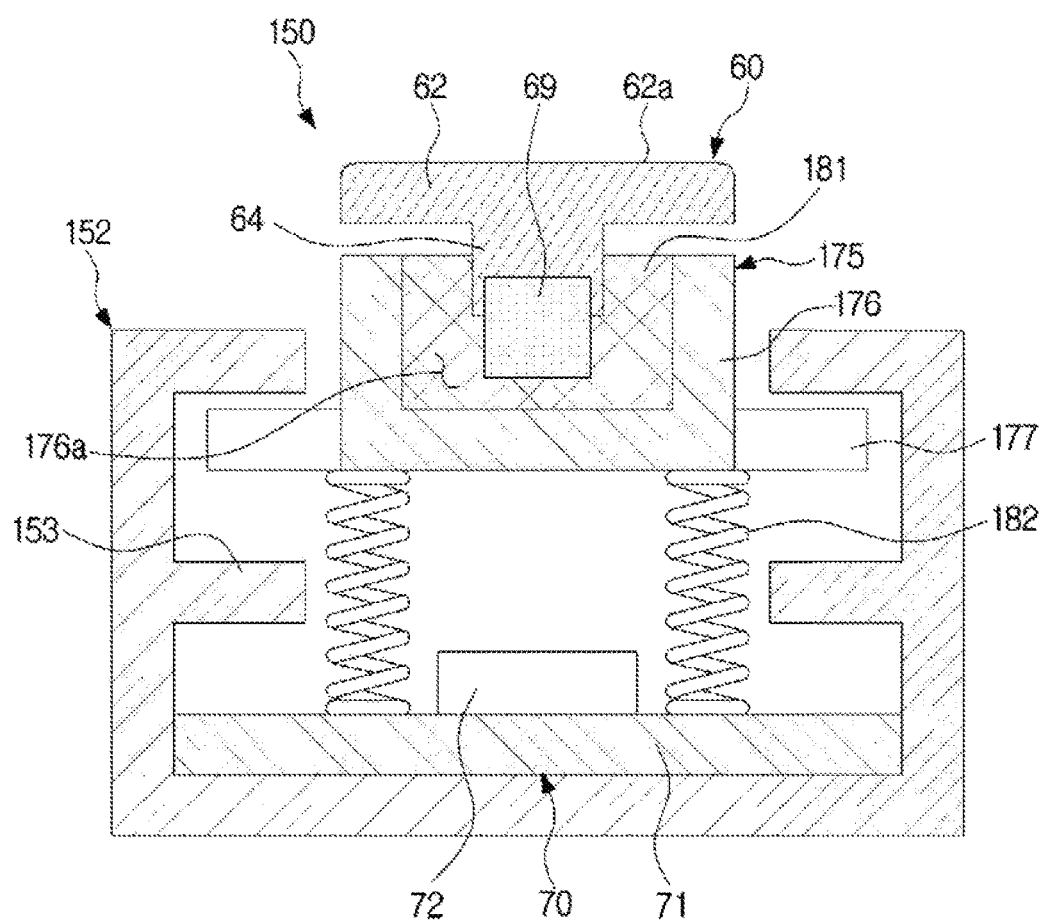
FIG. 7 is a cross-sectional view of an input device, according to another exemplary embodiment.

FIG. 7 is a cross-sectional view of an input device, according to another exemplary embodiment.

An input device 150 may include a case 152, the manipulator 60, a mount 175, and the sensor module 70.

The manipulator 60 may include the handle 62, the handle supporter 64, and the magnet 69.

The mount 175 may form an operation space 176a with the manipulator 60 arranged therein to be operated in the vertical direction along the Z-axis within the case 152.

The mount 175 may include a mounting part 176 on which the manipulator 60 is located. The mounting part 176 may be arranged to be separated from the manipulator 60 but have the manipulator 60 placed therein. The gap between the mounting part 176 and the manipulator 60 may be maintained by a first elastic member 181.

There are no limitations on the form of the first elastic member 181. In the exemplary embodiment, the first elastic member 181 may be an elastic material filling the operation space 176a. The manipulator 60 may be enclosed by the first elastic member 181, and the manipulator 60 and the first elastic member 181 may be located within the mounting part 176. FIG. 7 illustrates an exemplary embodiment in which the first elastic member 181 fills the gap between the mounting part 176 and the manipulator 60, but it is not limited thereto. For example, there may be a plurality of springs to elastically support the gap between the manipulator 60 and the mounting part 176.

This configuration may enable the manipulator 60 to be movable in the horizontal and vertical directions. Specifically, the manipulator 60 may be manipulated horizontally on the X- and Y-axes, and manipulated vertically along the Z-axis.

In exemplary embodiments, input device 150 may include a second elastic member 182 to elastically support the mount 175.

The second elastic member 182 may be arranged for the mount 175 to return to its original position even if the mount 175 is moved by an external force along the Z-axis.

The mount 175 may include a motion limitation protrusion 177. The motion limitation protrusion 177 may be formed on the circumference of the mounting part 176. The motion of the motion limitation protrusion 177 may be limited by a stopper 153 protruding inward from the case 152. The motion limitation protrusion 177 and the stopper 153 may limit the movement of the manipulator 60 and the mount 175 if the manipulator 60 is excessively pressurized by an external force and moved down with the mount 175.

First elastic member 181 may be referred to as an elastic member, and second elastic member 182 may be referred to as an auxiliary elastic member.

Another exemplary embodiment of an input device and display device including the input device will now be described. The same configurations as explained above will be omitted.

Figure 8:
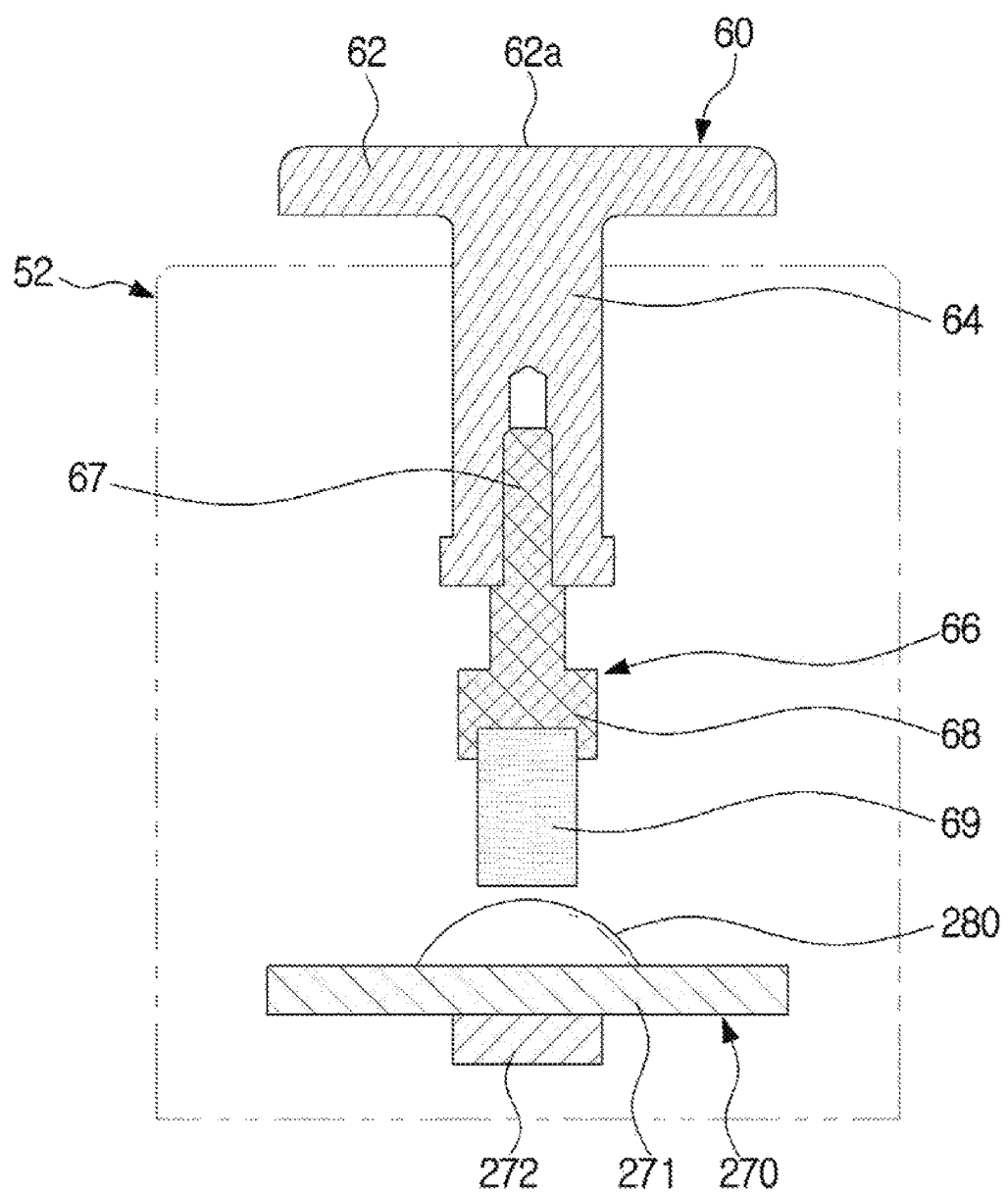
FIG. 8 is a schematic cross-sectional view of an input device, according to another exemplary embodiment.

FIG. 8 is a schematic cross-sectional view of an input device, according to another exemplary embodiment.

An elastic member 280 may be shaped as a dome.

Specifically, the elastic member 280 may be in the form of a dome swollen upward. Since the elastic member 280 is formed to be swollen upward, elastic power is produced by a pressing force applied onto the top.

When the manipulator 60 is moved down by an external force, it may elastically return to its original position by the elastic member 280. In exemplary embodiments, the downward movement of the manipulator 60 may be detected by a sensor 272 as well and a physical deformation of the elastic member 280 may also be detected, so the operation of the manipulator 60 may be detected more precisely.

The elastic member 280 may be formed on one side of a printed circuit board 271 of a sensor module 270, and the sensor 272 may be formed on an opposite side of the printed circuit board 271. This configuration may prevent interference between the elastic member 280 the sensor 272. This configuration may also locate the magnet 69 and the sensor 272 on the same axis.

Another exemplary embodiment of an input device and display device including the input device will now be described. The same configurations as explained above will be omitted.

Figure 9:
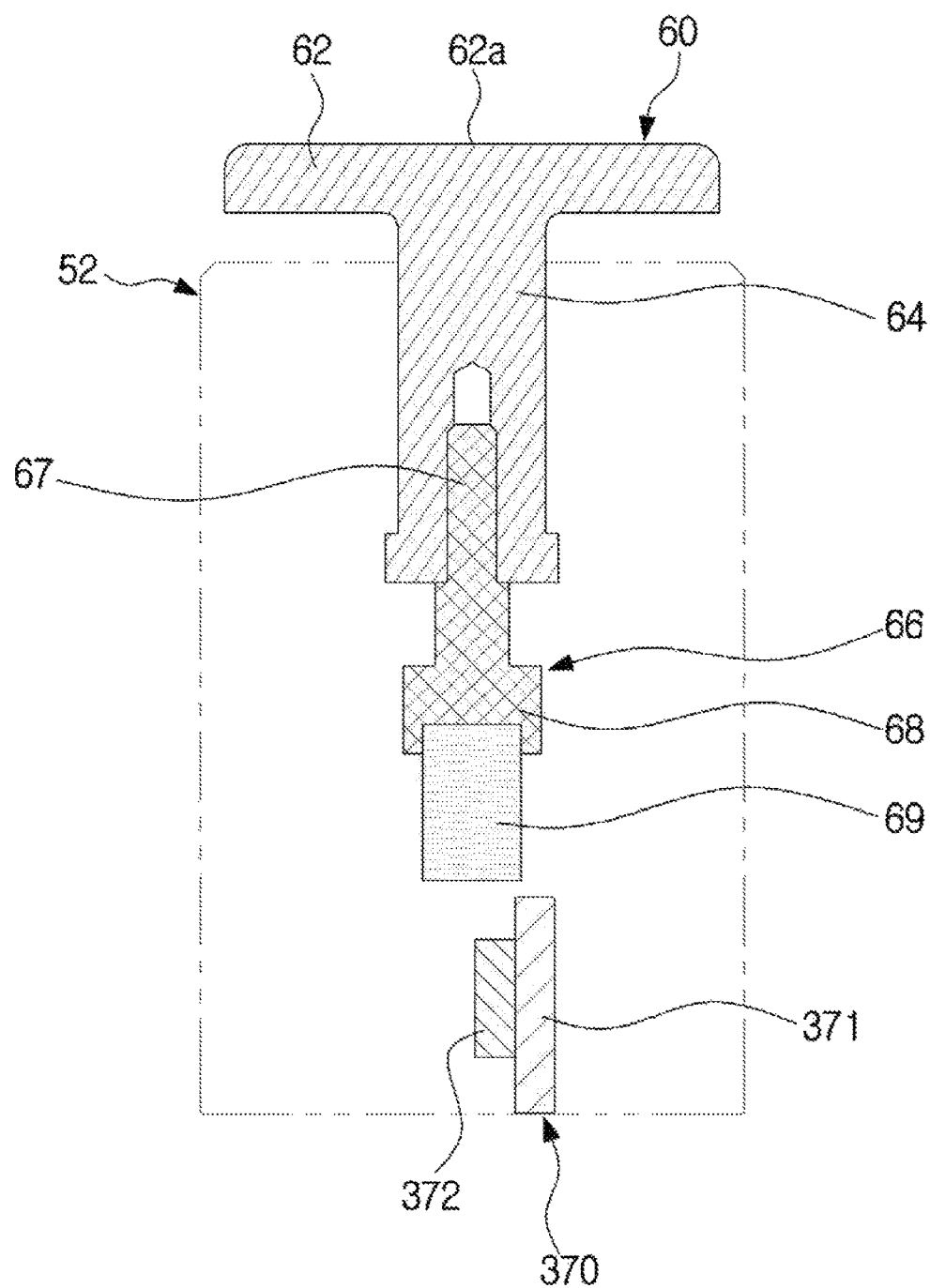
FIG. 9 is a schematic cross-sectional view of an input device, according to another exemplary embodiment.

FIG. 9 is a schematic cross-sectional view of an input device, according to another exemplary embodiment.

A sensor module 370 may include a sensor 372 and a printed circuit board 371.

The printed circuit board 371 may be arranged along the Z-axis. In other words, the printed circuit board 371 may be arranged in parallel with the vertical movement direction of the manipulator 60. This configuration may allow the input device 50 to have a slim figure or appearance in the X and Y-axes.

Another exemplary embodiment of an input device and display device including the input device will now be described. The same configurations as explained above will be omitted.

Figure 10:
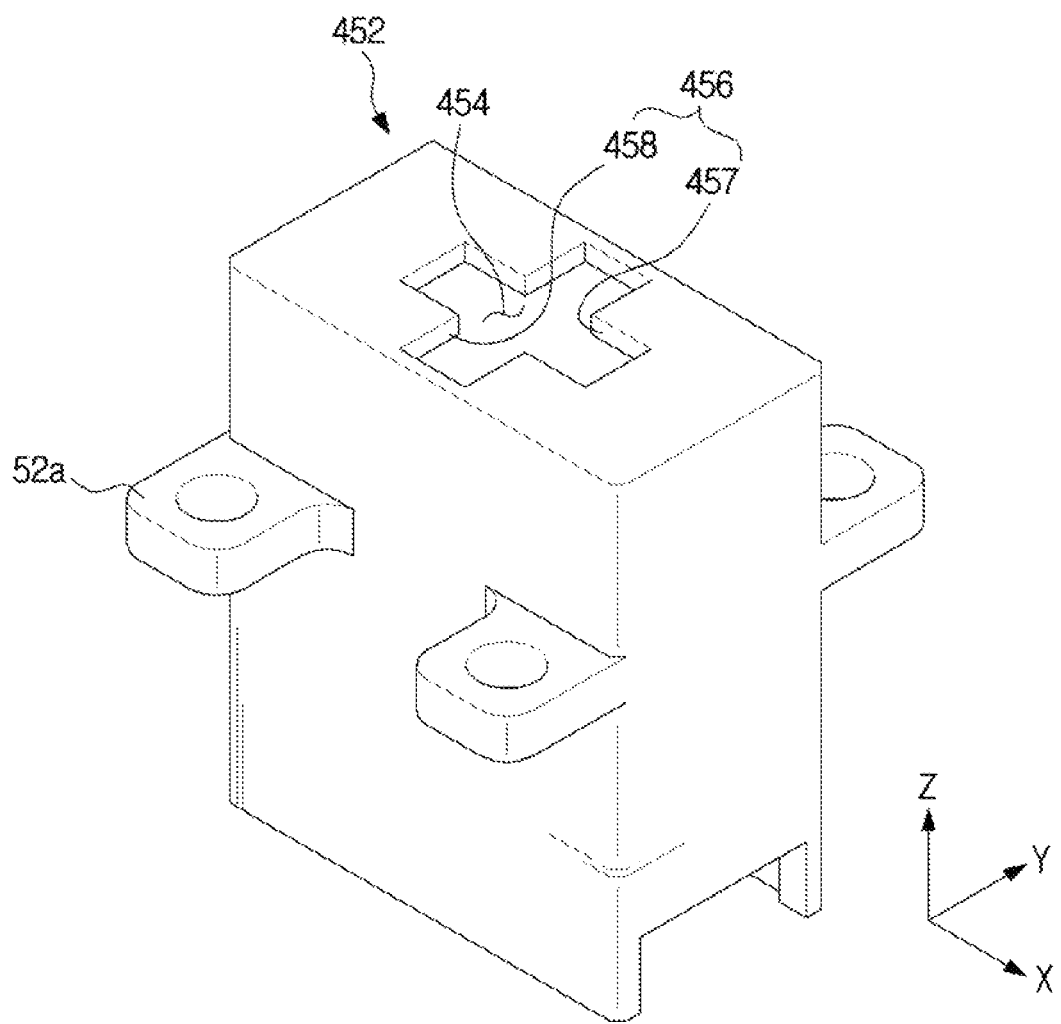
FIGS. 10 and 11 show a case of an input device, according to an exemplary embodiment.
Figure 11:
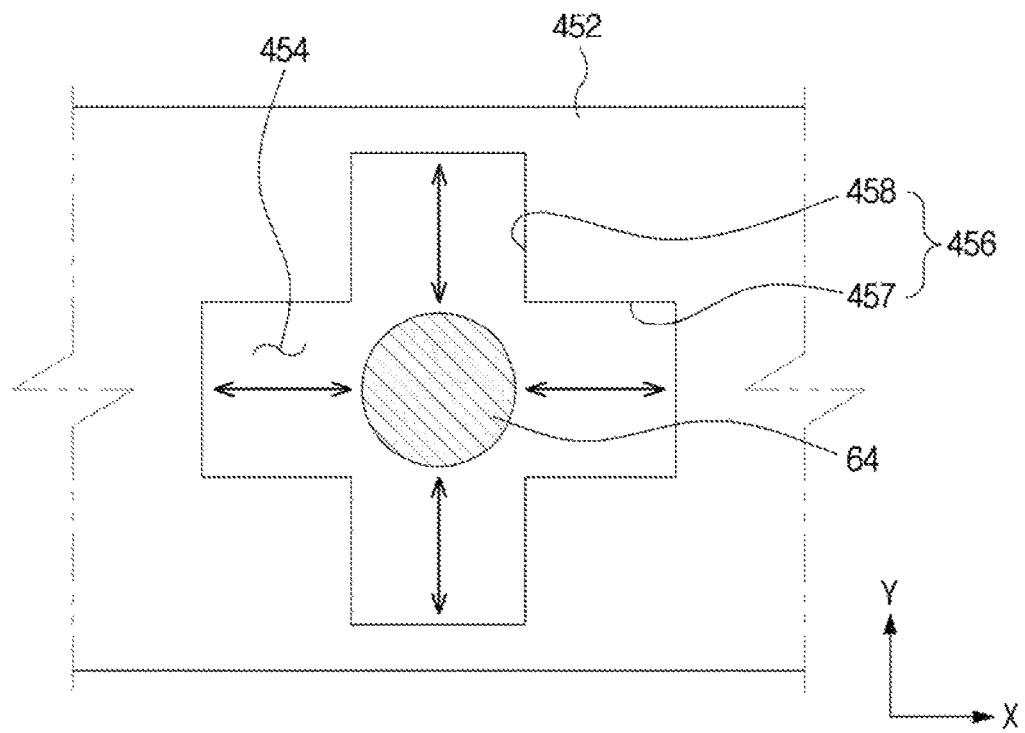

FIGS. 10 and 11 show a case of an input device, according to an exemplary embodiment.

A case 452 may form the exterior of the input device 50. The case 452 may be configured to expose the handle 62 of the manipulator 60 to the outside. The case 452 may have a moving hole 454 through which the handle supporter 64 passes.

The case 52 may form the moving hole 54, and include a motion guide 456 to limit horizontal movement of the manipulator 60.

The motion guide 456 may include a first guide 457 to guide X-axis movement and a second guide 458 to guide Y-axis movement. The first and second guides 457, 458 may be formed to cross each other at a right angle, consequently forming the figure of '+'. The motion guide 456 may limit the motion of the manipulator 60 to prevent the manipulator 60 from being forcedly moved, and instead allow the manipulator 60 to be manipulated within a certain range.

Another exemplary embodiment of an input device and display device including the input device will now be described. The same configurations as explained above will be omitted.

Figure 12:
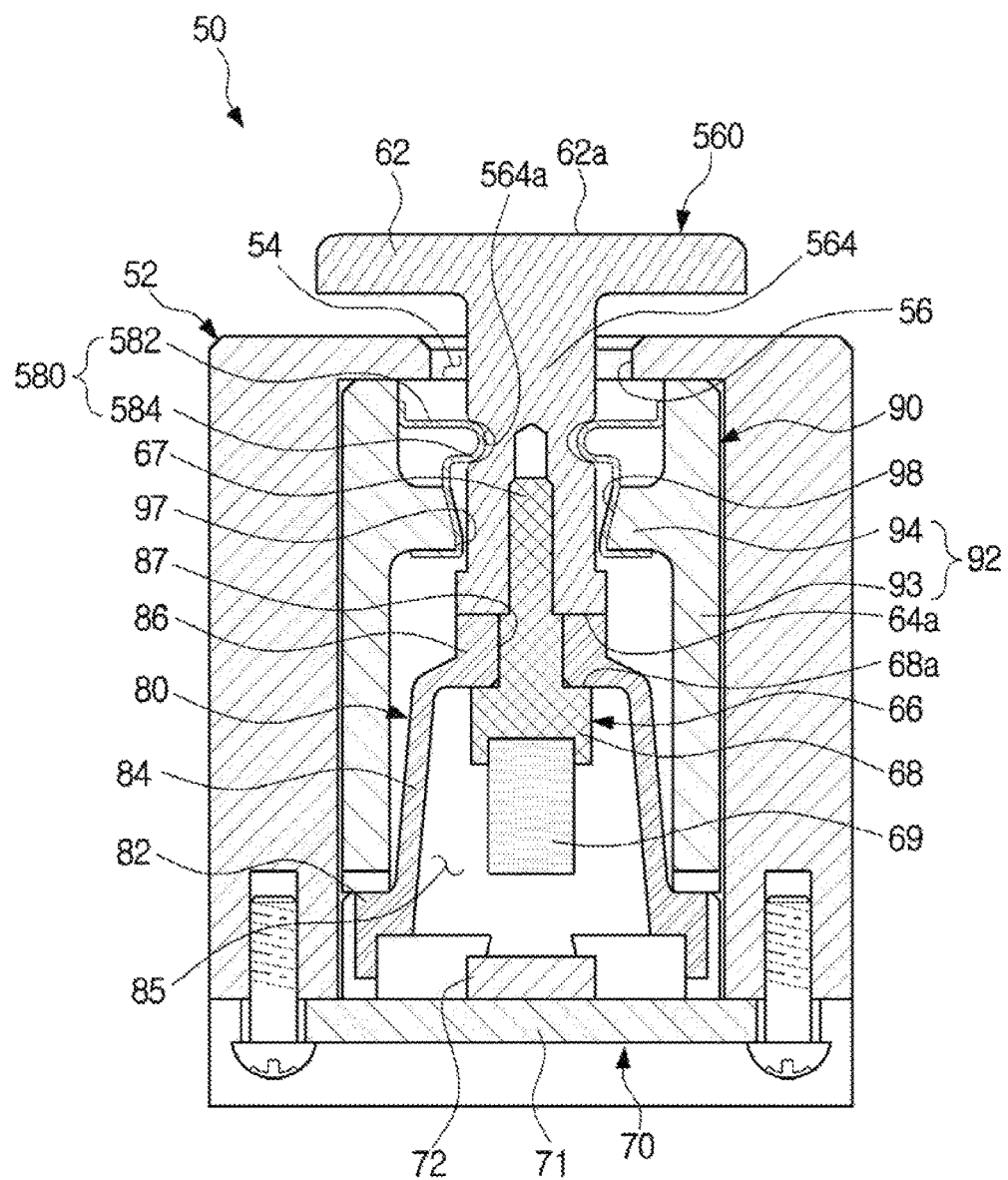
FIG. 12 is a cross-sectional view of an input device, according to another exemplary embodiment.

FIG. 12 is a cross-sectional view of an input device, according to another exemplary embodiment.

A manipulator 560 may include the handle 62, a handle supporter 564, and the magnet 69.

The handle supporter 564 may extend from the handle 62 and may be elastically supported by the elastic member 84. The handle supporter 564 may be shaped substantially like a rod.

The input device 50 may include a leaf spring 580.

The leaf spring 580 may elastically return to its original position even if the manipulator 60 is moved.

The leaf spring 580 may include a spring base 582, and a swollen spring area 584 protruding from the spring base 582. The swollen spring area 584 may be inserted to a spring insertion groove 564a formed around at least a part of the handle supporter 564.

If an external force is applied onto the manipulator 560 along the Z-axis, the manipulator 560 may be moved downward. At this time, the swollen spring area 584 may make contact along the slope of the moving spring insertion groove 564a, and the leaf spring 580 may be widened.

After that, if the external force is released, the leaf spring 580 having been widened by the elasticity of the leaf spring 580 elastically returns to its original position, and the manipulator 560 may be moved upward and returns to its original position for the swollen spring area 584 to be inserted to the spring insertion groove 564a.

Another exemplary embodiment of an input device and display device including the input device will now be described. The same configurations as explained above will be omitted.

Figure 13:
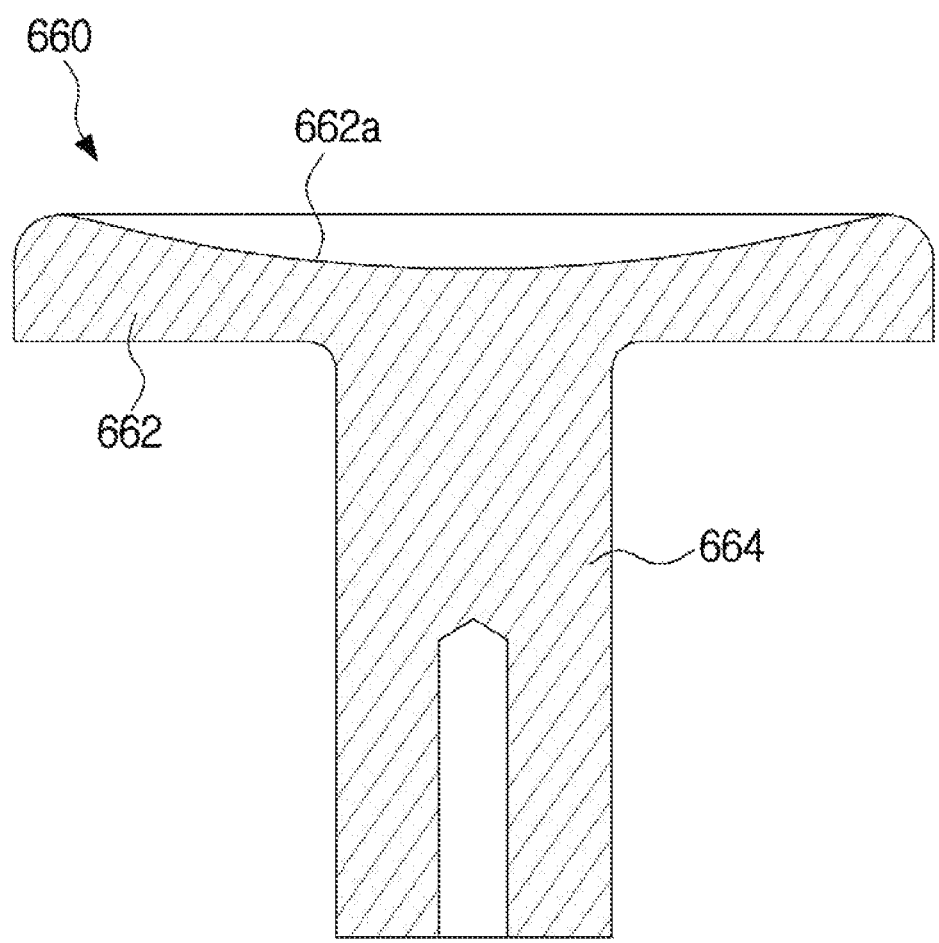
FIG. 13 shows a handle of an input device, according to an exemplary embodiment.

FIG. 13 shows a handle of an input device, according to an exemplary embodiment.

A manipulator 660 may include a handle 662 and a handle supporter 664.

The handle 662 is configured for the user to contact and manipulate it. The handle 662 may be a substantially circular plate. The form of the handle 662, however, is not limited thereto. A contact area 662a may be formed on the top face of the handle 662 for the user's finger to make contact.

The contact area 662a may be concavely formed on the body of the handle 662. The concave form of the contact area 662a may allow the user to make contact with a wider contact area 662a, enabling more stable manipulation on the manipulator 660.

Another exemplary embodiment of an input device and display device including the input device will now be described. The same configurations as explained above will be omitted.

Figure 14:
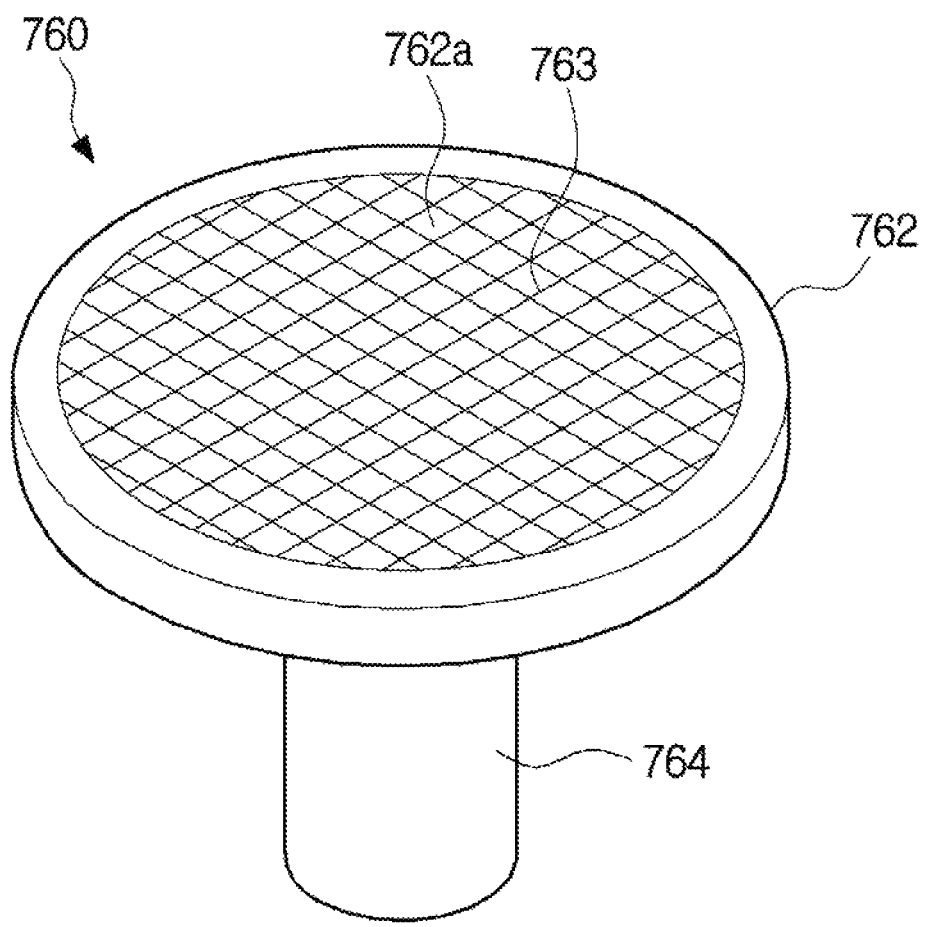
FIG. 14 shows a handle of an input device, according to another exemplary embodiment.

FIG. 14 shows a handle of an input device, according to another exemplary embodiment.

A manipulator 760 may include a handle 762 and a handle supporter 764.

The handle 762 is configured for the user to contact and manipulate it. The handle 762 may have the form of a substantially circular plate. The form of the handle 762, however, is not limited thereto. There may be a contact area 762a formed on the top side of the handle 762 for the user's finger to make contact.

The handle 762 may include a frictional groove 763, for example a lattice formed on the body of the handle 62 to increase frictional force. The frictional groove 763 may be formed on the contact area 762a of the handle 762, preventing the user from slipping on the handle 762. This may allow the user to make more stable and reliable manipulation on the manipulator 760.

According to exemplary embodiments, various commands may be entered through an input device and reliability of the input operation may be improved.

The improved structure of the input device may allow a display device to remain slim.

Furthermore, since moving operation of the input device may be performed without contact between some internal components of the input device, durability of the internal components may increase.

Several exemplary embodiments have been described above, but a person of ordinary skill in the art will understand and appreciate that various modifications can be made without departing the scope. Thus, it will be apparent to those ordinary skill in the art that the scope is defined by the following claims.

What is claimed is:

1. A display device comprising:
a display panel;
a chassis configured to support the display panel; and
an input device disposed on the chassis, wherein the input device comprises:
a manipulator configured to be horizontally movable and vertically movable, the manipulator comprising a magnet;
a sensor configured to detect a change in a magnetic force due to a motion of the magnet as a result of a motion of the manipulator, and to receive an input command based on the detected change in the magnetic force; and
an elastic member configured to elastically support the manipulator, the elastic member comprising:
an elastic supporter formed such that an outer circumferential surface thereof is inclined upward, and
a combiner formed on an upper portion of the elastic supporter, the combiner being combined with the manipulator,
wherein the elastic supporter is configured to elastically support the manipulator such that elasticity of the elastic supporter causes the manipulator to return to an original position, in an upward direction, after the manipulator is moved downward, and the elastic supporter is further configured to elastically deform such as to allow for the motion of the magnet that causes the change in the magnetic force that is detectable by the sensor.

2. The display device of claim 1, wherein the elastic member is configured to separate the manipulator from the sensor.

3. The display device of claim 2, wherein the elastic member is configured to elastically support a horizontal motion of the manipulator and a vertical motion of the manipulator, and to return the manipulator to the original position of the manipulator after completion of the horizontal motion and the vertical motion.

4. The display device of claim 1, wherein the manipulator comprises:
a handle configured to be manipulated by a user;
a handle supporter extending from the handle and elastically supported by the elastic member; and
a magnet holder including a holder body to which the magnet is fixed, and a holder supporter extending from the holder body and combined with the handle supporter,
wherein the combiner is located between the handle supporter and the holder body.

5. The display device of claim 4, wherein the combiner comprises:
a combining hole through which the holder supporter is configured to pass,
wherein a circumference of the handle supporter is greater than a diameter of the combining hole, and a circumference of the holder body is greater than the diameter of the combining hole.

6. The display device of claim 4, wherein the handle supporter comprises a concave spring insertion groove,
wherein the input device comprises a case configured to receive the manipulator,
wherein the case is configured to include the sensor, and to include a leaf spring in contact with the handle supporter, and
wherein the leaf spring comprises a base supported in the case, and a swollen spring area extending from the base and configured to be inserted into the concave spring insertion groove to produce elastic force from a movement of the manipulator.

7. The display device of claim 4, wherein the handle comprises:
a handle body comprising a circular plate; and
a concave contact area formed on the handle body.

8. The display device of claim 4, wherein the handle comprises:
a handle body comprising a circular plate; and
a plurality of frictional grooves arranged in a lattice pattern formed on the handle body to increase frictional force.

9. The display device of claim 1, further comprising:
a case including a motion guide configured to limit a horizontal motion of the manipulator,
wherein the motion guide comprises:
a pair of first guides configured to limit a first directional motion of the manipulator to remain with a first range; and
a pair of second guides connected to the pair of first guides, the pair of second guides being configured to limit a second directional motion of the manipulator to a second range, the second directional motion being perpendicular to the first directional motion.

10. The display device of claim 1, further comprising a controller configured to execute an input command based on the change in the magnetic force detected by the sensor.

11. The display device of claim 1, further comprising:
a printed circuit board having a first side and a second side, wherein the sensor is mounted on the first side,
wherein the elastic member is arranged on the second side of the printed circuit board, and
wherein the elastic member is extended toward the manipulator, and is configured to elastically return the manipulator to the original position of the manipulator after completion of a vertical motion of the manipulator.

12. The display device of claim 1, further comprising a printed circuit board having the sensor mounted on a side of the printed circuit board, wherein the printed circuit board is arranged in parallel with a vertical movement direction of the manipulator.

13. The display device of claim 1, wherein the input device comprises:
a case including a motion guide configured to limit a horizontal motion of the manipulator,
wherein the motion guide comprises a first guide configured to guide a motion of the manipulator in a first direction, and a second guide configured to guide a motion of the manipulator in a second direction, the second direction being perpendicular to the first direction.

14. The display device of claim 1, wherein a portion of the combiner is above the magnet, and the manipulator is configured to push a top face of the portion of the combiner downward when moving the magnet downward.

15. An input device comprising:
a case;
a handle configured to be exposed outside of the case for manipulation;
a manipulator having a magnet configured to be horizontally and vertically movable by a movement of the handle;
a sensor module including a sensor configured to detect a change in a magnetic force due to a movement of the magnet, the sensor being mounted on a printed circuit board; and
an elastic member configured to elastically support the manipulator and separate the manipulator from the sensor, the elastic member comprising:
a base part supported by the sensor module;
an elastic supporter extending upward from the base part, wherein an outer circumferential surface of the elastic supporter is inclined upward; and
a combiner formed on a top surface of the elastic supporter, the combiner being combined with the manipulator,
wherein the elastic supporter is configured to elastically support the manipulator such that elasticity of the elastic supporter causes the manipulator to return to an original position, in an upward direction, after the manipulator is moved downward, and the elastic supporter is further configured to elastically deform such as to allow for the motion of the magnet that causes the change in the magnetic force that is detectable by the sensor.

16. A display device comprising:
a display panel;
a chassis configured to support the display panel; and
an input device disposed on the chassis, wherein the input device comprises:
an elastic member comprising a combiner;
a sensor; and
a manipulator configured to be horizontally movable and vertically movable, the manipulator comprising:
a magnet;
a handle supporter extending from a handle and elastically supported by the elastic member; and
a magnet holder including a holder body to which the magnet is fixed and a holder supporter extending from the holder body and combined with the handle supporter,
wherein the sensor is configured to detect a change in a magnetic force due to a motion of the magnet as a result of a motion of the manipulator, and to receive an input command based on the detected change in the magnetic force, and
wherein the combiner is located between the handle supporter and the holder body.

17. The display device of claim 16, wherein the elastic member is configured to elastically support the manipulator, and to separate the manipulator from the sensor.

18. The display device of claim 16, wherein the elastic member further comprises an elastic supporter having a top surface,
wherein an outer circumference of the elastic supporter decreases toward the top surface, and
wherein the combiner is formed on the top surface of the elastic supporter, the combiner being combined with the manipulator.

19. The display device of claim 16, wherein the manipulator further comprises a handle configured to be manipulated by a user.

* * * * *